United States Patent
Chien et al.

(10) Patent No.: US 10,096,635 B2
(45) Date of Patent: Oct. 9, 2018

(54) SEMICONDUCTOR STRUCTURE AND MANUFACTURING METHOD THEREOF

(71) Applicant: XINTEC INC., Taoyuan (TW)

(72) Inventors: Wei-Ming Chien, Taoyuan (TW); Po-Han Lee, Taipei (TW); Tsang-Yu Liu, Zhubei (TW); Yen-Shih Ho, Kaohsiung (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/819,138

(22) Filed: Aug. 5, 2015

(65) Prior Publication Data

US 2016/0043123 A1    Feb. 11, 2016

Related U.S. Application Data

(60) Provisional application No. 62/034,777, filed on Aug. 8, 2014.

(51) Int. Cl.
   *H01L 27/146*   (2006.01)

(52) U.S. Cl.
   CPC .. *H01L 27/14623* (2013.01); *H01L 27/14632* (2013.01); *H01L 27/14636* (2013.01); *H01L 27/14685* (2013.01); *H01L 27/14687* (2013.01); *H01L 2224/11* (2013.01)

(58) Field of Classification Search
   CPC .................................................. H01L 27/14623
   See application file for complete search history.

(56) References Cited

U.S. PATENT DOCUMENTS

| | | | | |
|---|---|---|---|---|
| 6,815,654 B1 * | 11/2004 | Fujieda | ............. | H01L 27/14643 250/208.1 |
| 2005/0161805 A1 * | 7/2005 | Ono | .................. | H01L 27/14618 257/704 |
| 2009/0085134 A1 * | 4/2009 | Park | .................. | H01L 27/14618 257/432 |
| 2011/0267534 A1 | 11/2011 | Tsai | | |
| 2014/0117203 A1 | 5/2014 | Lin et al. | | |
| 2014/0210069 A1 * | 7/2014 | Chang | ............... | H01L 27/14618 257/712 |
| 2015/0077625 A1 * | 3/2015 | Ferraris | ................ | H04N 5/2257 348/373 |
| 2015/0116954 A1 * | 4/2015 | Jan | ........................... | H05K 1/18 361/740 |

(Continued)

FOREIGN PATENT DOCUMENTS

| | | |
|---|---|---|
| CN | 103066089 | 4/2013 |
| TW | 201123373 | 7/2011 |
| TW | 201138123 | 11/2011 |

(Continued)

*Primary Examiner* — Su C Kim
*Assistant Examiner* — David S Wilbert
(74) *Attorney, Agent, or Firm* — Liu & Liu

(57) ABSTRACT

A semiconductor structure includes a chip, a light transmissive plate, a spacer, and a light-shielding layer. The chip has an image sensor, a first surface and a second surface opposite to the first surface. The image sensor is located on the first surface. The light transmissive plate is disposed on the first surface and covers the image sensor. The spacer is between the light transmissive plate and the first surface, and surrounds the image sensor. The light-shielding layer is located on the first surface between the spacer and the image sensor.

16 Claims, 6 Drawing Sheets

(56) References Cited

U.S. PATENT DOCUMENTS

2016/0043125 A1\* 2/2016 Hatano ............. H01L 27/14629
257/40

FOREIGN PATENT DOCUMENTS

| TW | 201143037 | 12/2011 |
| TW | 201143039 | 12/2011 |
| TW | M470285 | 1/2014 |

\* cited by examiner

SEMICONDUCTOR STRUCTURE AND MANUFACTURING METHOD THEREOF

RELATED APPLICATIONS

This application claims priority to U.S. provisional Application Ser. No. 62/034,777, filed Aug. 8, 2014, which is herein incorporated by reference.

BACKGROUND

Field of Invention

The present invention relates to a semiconductor structure and a manufacturing method of the semiconductor structure.

Description of Related Art

In manufacture of a semiconductor structure used in an image-sensing device, a light transmissive glass may be disposed on a chip to protect an image sensor of the chip. When a light irradiates the chip through the glass, the image sensor can detect an object image outside the semiconductor structure.

However, random reflection and random refraction of light are prone to occur in a conventional semiconductor structure, and thus an image sensor may detect noise lights which may cause ghost images. As a result, in a subsequent manufacturing process, it is difficult to adjust parameters (e.g., brightness or contrast) to improve image conditions that are received by the image sensor, and thus it is not easy to control the yield of the semiconductor structure.

SUMMARY

An aspect of the present invention is to provide a semiconductor structure.

According to an embodiment of the present invention, a semiconductor structure includes a chip, a light transmissive plate, a spacer, and a light-shielding layer. The chip has an image sensor and a surface, and the image sensor is located on the surface. The light transmissive plate is disposed on the surface of the chip and covers the image sensor. The spacer is between the light transmissive plate and the surface of the chip, and surrounds the image sensor. The light-shielding layer is located on the surface that is between the spacer and the image sensor.

In one embodiment of the present invention, the light-shielding layer is made of a material including black photoresist.

In one embodiment of the present invention, the light-shielding layer extends to between the spacer and the surface of the chip.

In one embodiment of the present invention, the light-shielding layer is an anti-infrared layer.

In the aforementioned embodiments of the present invention, the spacer surrounds the image sensor and the light-shielding layer is located on the surface of the chip between the spacer and the image sensor. Hence, when a light irradiates the chip through the light transmissive plate, the light-shielding layer may absorb noise lights, such that the noise lights may be filtered out to prevent the image sensor from generating ghost images.

Another aspect of the present invention is to provide a semiconductor structure.

According to an embodiment of the present invention, a semiconductor structure includes a chip, a light transmissive plate, a spacer, and a reflective layer. The chip has an image sensor, a first surface, and a second surface opposite to the first surface. The image sensor is located on the first surface. The light transmissive plate is disposed on the first surface of the chip and covers the image sensor. The spacer is between the light transmissive plate and the first surface of the chip, and surrounds the image sensor. The reflective layer is located on the second surface of the chip, and the orthogonal projection of the image sensor on the second surface overlaps the reflective layer.

In one embodiment of the present invention, the reflective layer is made of a material including aluminum-copper alloy.

In one embodiment of the present invention, the semiconductor structure further includes an isolation layer. The isolation layer covers the second surface of the chip.

In one embodiment of the present invention, the area of the reflective layer is greater than the area of the image sensor.

In one embodiment of the present invention, the reflective layer is an anti-infrared layer.

In the aforementioned embodiments of the present invention, the reflective layer is located on the second surface of the chip and the orthogonal projection of the image sensor on the second surface overlaps the reflective layer. Hence, when a light irradiates the chip through the light transmissive plate, the reflective layer may totally reflect noise lights to prevent the image sensor from generating ghost images.

Another aspect of the present invention is to provide a semiconductor structure.

According to an embodiment of the present invention, a semiconductor structure includes a chip, a light transmissive plate, a spacer, and a light-shielding layer. The chip has an image sensor, a first surface, and a second surface opposite to the first surface. The image sensor is located on the first surface of the chip. The light transmissive plate is disposed on the first surface of the chip and covers the image sensor. The spacer is between the light transmissive plate and the first surface of the chip, and surrounds the image sensor. The light-shielding layer is located on the second surface of the chip, and the orthogonal projection of the image sensor on the second surface overlaps the light-shielding layer.

In one embodiment of the present invention, the light-shielding layer is made of a material including black photoresist.

In one embodiment of the present invention, the semiconductor structure further includes an isolation layer. The isolation layer is between the second surface of the chip and the light-shielding layer.

In one embodiment of the present invention, the semiconductor structure further includes an isolation layer. The isolation layer covers the light-shielding layer and the second surface of the chip.

In one embodiment of the present invention, the area of the light-shielding layer is greater than the area of the image sensor.

In one embodiment of the present invention, the light-shielding layer is an anti-infrared layer.

In the aforementioned embodiments of the present invention, the light-shielding layer is located on the second surface of the chip, and the orthogonal projection of the image sensor on the second surface overlaps the light-shielding layer. Hence, when a light irradiates the chip through the light transmissive plate, the light-shielding layer may absorb noise lights, such that the noise lights may be filtered out to prevent the image sensor from generating ghost images.

Another aspect of the present invention is to provide a manufacturing method of a semiconductor structure.

According to an embodiment of the present invention, a manufacturing method of a semiconductor structure includes the following steps. A light-shielding layer is formed on a surface of a chip, and the chip has an image sensor on the surface. A spacer is formed on a light transmissive plate or the surface of the chip. The light transmissive plate is bonded to the surface of the chip, such that the light-shielding layer is located on the surface that is between the spacer and the image sensor.

In one embodiment of the present invention, the manufacturing method of the semiconductor further includes forming the light-shielding layer between the spacer and the surface of the chip.

Another aspect of the present invention is to provide a manufacturing method of a semiconductor structure.

According to an embodiment of the present invention, a manufacturing method of a semiconductor structure includes the following steps. A spacer is formed on a light transmissive plate or a first surface of a chip. The light transmissive plate is bonded to the first surface of the chip, such that the spacer surrounds an image sensor of the chip. A reflective layer is formed on a second surface of the chip opposite to the first surface, such that the orthogonal projection of the image sensor on the second surface overlaps the reflective layer.

Another aspect of the present invention is to provide a manufacturing method of a semiconductor structure.

According to an embodiment of the present invention, a manufacturing method of a semiconductor structure includes the following steps. A spacer is formed on a light transmissive plate or a first surface of a chip. The light transmissive plate is bonded to the first surface of the chip, such that the spacer surrounds an image sensor of the chip. A light-shielding layer is formed on a second surface of the chip opposite to the first surface, such that the orthogonal projection of the image sensor on the second surface overlaps the light-shielding layer.

In one embodiment of the present invention, the manufacturing method of the semiconductor further includes forming an isolation layer between the second surface of the chip and the light-shielding layer or to cover the light-shielding layer and the second surface of the chip.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
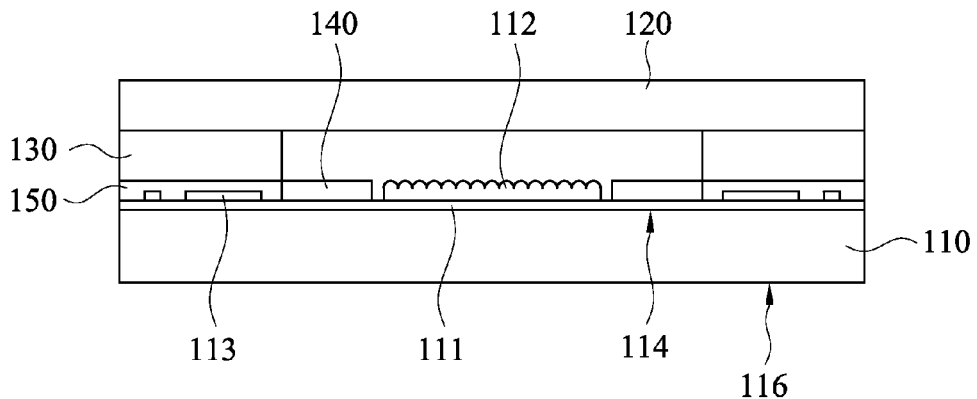
FIG. 1 is a schematic cross-sectional view of a semiconductor structure according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic cross-sectional view of a semiconductor structure 100 according to one embodiment of the present invention. As shown in FIG. 1, the semiconductor structure 100 includes a chip 110, a light transmissive plate 120, a spacer 130, and a light-shielding layer 140. The chip 110 has an image sensor 112, a first surface 114, and a second surface 116 opposite to the first surface 114. The image sensor 112 is located on the first surface 114 of the chip 110. The light transmissive plate 120 is disposed on the first surface 114 of the chip 110 and covers the image sensor 112. The spacer 130 is between the light transmissive plate 120 and the first surface 114 of the chip 110, and surrounds the image sensor 112. The light-shielding layer 140 is located on the first surface 114 that is between the spacer 130 and the image sensor 112. Moreover, the first surface 114 of the chip 110 may further have a protection layer 111 and a conductive pad 113. The spacer 130 may be fixed on the first surface 114 of the chip 110 by an adhesive layer 150.

In this embodiment, the semiconductor structure 100 may be an image-sensing device, such as a front side or back side illumination CMOS image-sensing device. The chip 110 may be made of a material including silicon, such as a silicon substrate. The chip 110 may be a portion of a wafer which is not yet divided into plural chips, or may be one of plural chips diced from a wafer, and the present invention is not limited in this regard. The light transmissive plate 120 may be made of a material including glass, acrylic, or plastic. The adhesive layer 150 may be made of a material including epoxy. The light-shielding layer 140 may be made of a material including black photoresist, but the present invention is not limited thereto, other types of light absorbing materials with dark colors may also be used to manufacture the light-shielding layer 140. Furthermore, the light-shielding layer 140 may also be an anti-infrared layer.

Since the light-shielding layer 140 is located on the first surface 114 that is between the spacer 130 and the image sensor 112, the light-shielding layer 140 surrounds the image sensor 112. As a result of such a design, when light that is not perpendicular to the light transmissive plate 120 irradiates the chip 110 through the light transmissive plate 120, the light-shielding layer 140 may absorb noise lights, such that the noise lights may be filtered out to prevent the image sensor 112 from receiving the noise lights causing ghost images. The noise lights are referred to as lights refracted or reflected by the light transmissive plate 120 and the chip 110. Consequently, in a back-end process, because the ghost images will not occur, a technical person may adjust parameters (e.g., brightness or contrast) to improve image conditions received by the image sensor 112 briefly, thereby improving the yield of the semiconductor structure 100.

It is to be noted that the connection relationships and materials of the elements described above will not be repeated in the following description, and only aspects related to other types of semiconductor structures and manufacturing methods thereof will be described.

Figure 2:
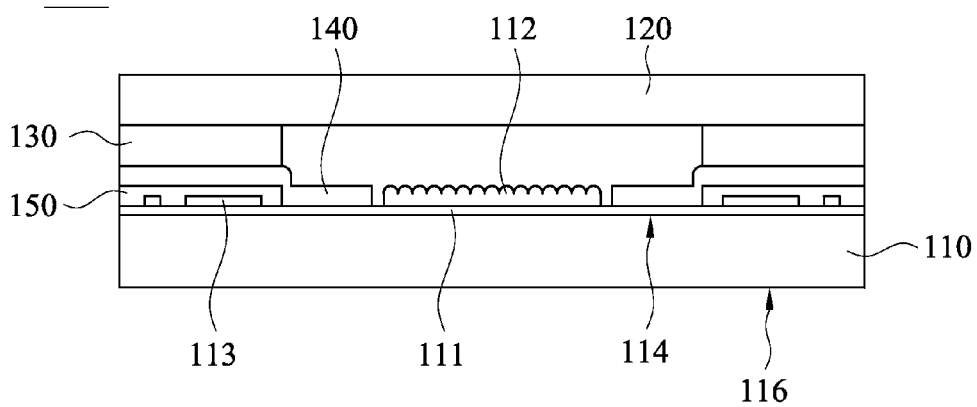
FIG. 2 is a schematic cross-sectional view of a semiconductor structure according to one embodiment of the present invention.

FIG. 2 is a schematic cross-sectional view of a semiconductor structure 100a according to one embodiment of the present invention. The semiconductor structure 100a includes the chip 110, the light transmissive plate 120, the spacer 130, and the light-shielding layer 140. The difference between this embodiment and the embodiment shown in FIG. 1 is that the light-shielding layer 140 extends to between the spacer 130 and the first surface 114 of the chip 110. In this embodiment, when light that is not perpendicular to the light transmissive plate 120 irradiates the chip 110 through the light transmissive plate 120, the light-shielding layer 140 can absorb noise lights, such that the noise lights may be filtered out to prevent the image sensor 112 from receiving the noise lights causing ghost images.

Figure 3:
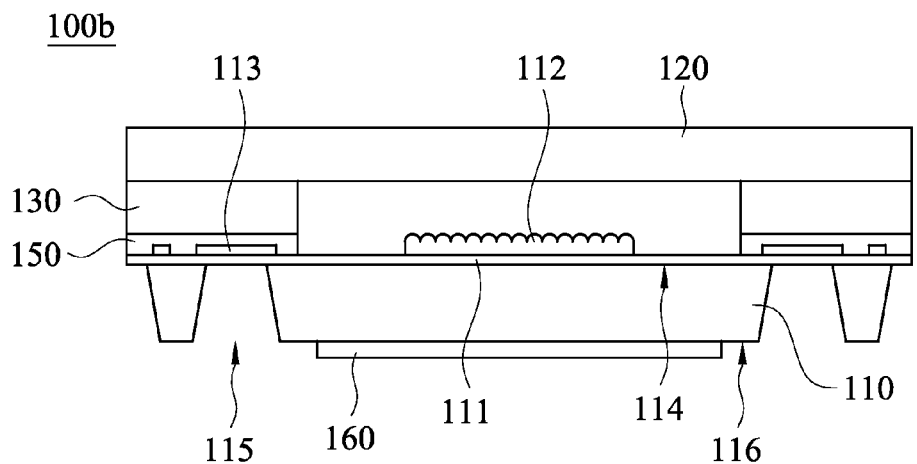
FIG. 3 is a schematic cross-sectional view of a semiconductor structure according to one embodiment of the present invention.

FIG. 3 is a schematic cross-sectional view of a semiconductor structure 100b according to one embodiment of the present invention. As shown in FIG. 3, the semiconductor structure 100b includes the chip 110, the light transmissive plate 120, the spacer 130, and a reflective layer 160. The chip 110 has the image sensor 112, the first surface 114, and the second surface 116 opposite to the first surface 114. The image sensor 112 is located on the first surface 114 of the chip 110. The light transmissive plate 120 is disposed on the first surface 114 of the chip 110 and covers the image sensor 112. The spacer 130 is between the light transmissive plate 120 and the first surface 114 of the chip 110, and surrounds the image sensor 112. The reflective layer 160 is located on the second surface 116 of the chip 110. The reflective layer 160 may be made of a material including aluminum-copper alloy for reflecting light. Moreover, the reflective layer 160 may be an anti-infrared layer. The orthogonal projection of the image sensor 112 on the second surface 116 overlaps the reflective layer 160. In this embodiment, the chip 110 further has a through hole 115 passing through the first surface 114 and the second surface 116.

Since the reflective layer 160 is located on the second surface 116 of the chip 110 and the orthogonal projection of the image sensor 112 on the second surface 116 overlaps the reflective layer 160, the reflective layer 160 may totally reflect noise lights when light that is not perpendicular to the light transmissive plate 120 irradiates the chip 110 through the light transmissive plate 120. The reflective layer 160 may prevent the image sensor 112 from receiving noise lights causing ghost images. Consequently, in a back-end process, the ghost images will not occur, and a technical person may adjust parameters (e.g., brightness or contrast) to improve image conditions received by the image sensor 112 briefly, thereby improving the yield of the semiconductor structure 100b. In this embodiment, the area of the reflective layer 160 may be greater than the area of the image sensor 112 to improve the reflective capability of the reflective layer 160.

Figure 4:
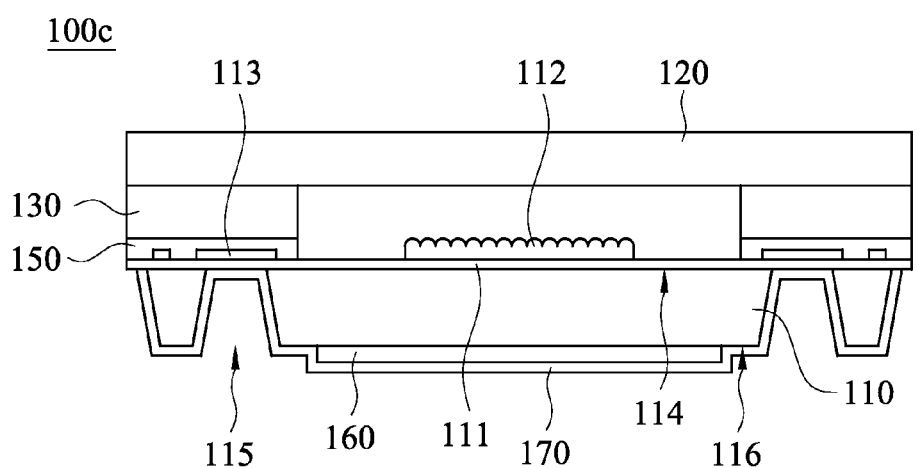
FIG. 4 is a schematic cross-sectional view of a semiconductor structure according to one embodiment of the present invention.

FIG. 4 is a schematic cross-sectional view of a semiconductor structure 100c according to one embodiment of the present invention. The semiconductor structure 100c includes the chip 110, the light transmissive plate 120, the spacer 130, and the reflective layer 160. The difference between this embodiment and the embodiment shown in FIG. 3 is that the semiconductor structure 100c further includes an isolation layer 170. The isolation layer 170 covers the reflective layer 160 and the second surface 116 of the chip 110. In other words, in manufacture of the semiconductor structure 100c, the operation of forming the reflective layer 160 is performed before the operation of forming the isolation layer 170.

In this embodiment, the isolation layer 170 may be made of a material including silicon oxide and may be formed by using chemical vapor deposition (CVD), for example.

Figure 5:
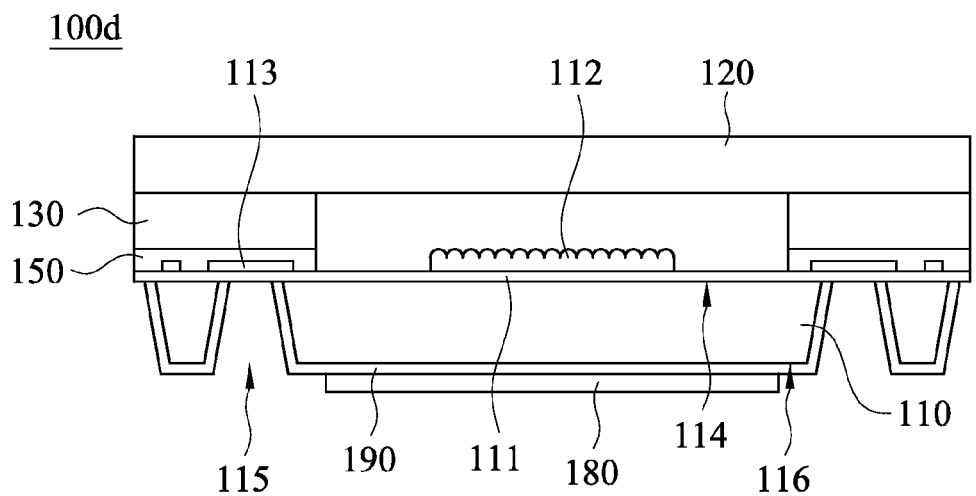
FIG. 5 is a schematic cross-sectional view of a semiconductor structure according to one embodiment of the present invention.

FIG. 5 is a schematic cross-sectional view of a semiconductor structure 100d according to one embodiment of the present invention. As shown in FIG. 5, the semiconductor structure 100d includes the chip 110, the light transmissive plate 120, the spacer 130, and a light-shielding layer 180. The chip 110 has the image sensor 112, the first surface 114, and the second surface 116 opposite to the first surface 114. The image sensor 112 is located on the first surface 114 of the chip 110. The light transmissive plate 120 is disposed on the first surface 114 of the chip 110 and covers the image sensor 112. The spacer 130 is between the light transmissive plate 120 and the first surface 114 of the chip 110, and surrounds the image sensor 112. The light-shielding layer 180 is located on the second surface 116 of the chip 110, and the orthogonal projection of the image sensor 112 on the second surface 160 overlaps the light-shielding layer 180.

In this embodiment, the light-shielding layer 180 may be made of a material including black photoresist. Alternatively, the light-shielding layer 180 may be an anti-infrared layer. The semiconductor structure 100d further includes an isolation layer 190. The isolation layer 190 covers the second surface 116 of the chip 110 and is between the second surface 116 of the chip 110 and the light-shielding layer 180. In other words, in manufacture of the semiconductor structure 100d, the operation of forming the light-shielding layer 180 is performed after the operation of forming the isolation layer 190.

Since the light-shielding layer 180 is located on the second surface 116 of the chip 110 and the orthogonal projection of the image sensor 112 on the second surface 116 overlaps the light-shielding layer 180, the light-shielding layer 180 may absorb noise lights when light that is not perpendicular to the light transmissive plate 120 irradiates the chip 110 through the light transmissive plate 120. The noise lights may be filtered out to prevent the image sensor 112 from receiving the noise lights causing ghost images. Consequently, in a back-end process, the ghost images will not occur, and a technical person may adjust parameters (e.g., brightness or contrast) to improve image conditions received by the image sensor 112 briefly, thereby improving the yield of the semiconductor structure 100d. In this embodiment, the area of the light-shielding layer 180 may be greater than the area of the image sensor 112 to improve the light absorption capability of the light-shielding layer 180.

Figure 6:
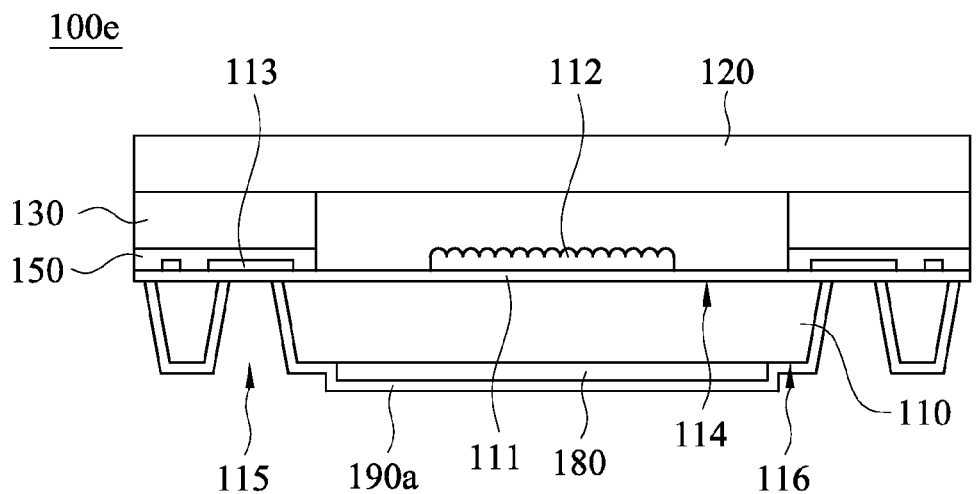
FIG. 6 is a schematic cross-sectional view of a semiconductor structure according to one embodiment of the present invention.

FIG. 6 is a schematic cross-sectional view of a semiconductor structure 100e according to one embodiment of the present invention. The semiconductor structure 100e includes the chip 110, the light transmissive plate 120, the spacer 130, and the light-shielding layer 180. The difference between this embodiment and the embodiment shown in FIG. 5 is that the semiconductor structure 100c further includes an isolation layer 190a, but not include the isolation layer 190 (see FIG. 5). The isolation layer 190a covers the light-shielding layer 180 and the second surface 116 of the chip 110. In other words, in manufacture of the semiconductor structure 100e, the operation of forming the light-shielding layer 180 is before the operation of forming the isolation layer 190a.

In the following description from FIG. 7 to FIG. 9, the semiconductor structure 100a of FIG. 2 is used for an example to explain structures that may be formed in subsequent processes for manufacturing.

Figure 7:
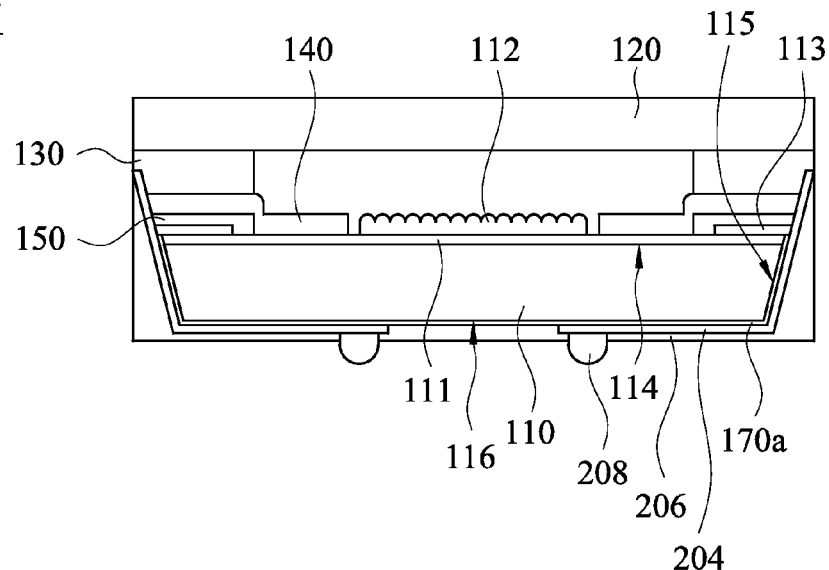
FIG. 7 is a schematic cross-sectional view of a semiconductor structure according to one embodiment of the present invention.

FIG. 7 is a schematic cross-sectional view of a semiconductor structure 100f according to one embodiment of the present invention. The chip 110 has a through hole 115 that exposes the conductive pad 113. In this embodiment, the through hole 115 is a notch type, thereby exposing the side surface of the conductive pad 113. The semiconductor structure 100f further includes an isolation layer 170a, a redistribution layer 204, and a solder mask layer 206. The isolation layer 170a is located on the wall surface of the through hole 115 and the second surface 116. The redistribution layer 204 is located on the conductive pad 113 and the isolation layer 170a. The redistribution layer 204 is in electrical contact with the side surface of the conductive pad 113. The solder mask layer 206 is located on the redistribution layer 204 and the isolation layer 170a. The solder mask layer 206 may be, but not limited to solder mask. The conductive structure 208 is located on the redistribution layer 204 that is on the second surface 116, such that the conductive structure 208 may be electrically connected to the conductive pad 113 through the redistribution layer 204. The conductive structure 208 may be a solder ball or conductive bump, but the present invention is not limited in this regard. Moreover, at least a portion of the orthogonal projection of the conductive structure 208 on the first surface 114 overlaps the image sensor 112.

Figure 8:
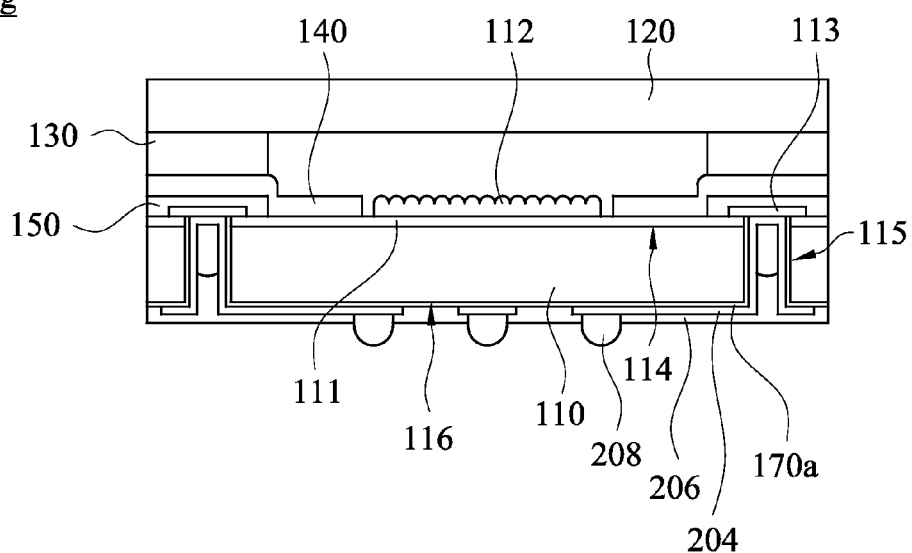
FIG. 8 is a schematic cross-sectional view of a semiconductor structure according to one embodiment of the present invention.

FIG. 8 is a schematic cross-sectional view of a semiconductor structure 100g according to one embodiment of the present invention. The difference between this embodiment and the embodiment shown in FIG. 7 is that the wall of the through hole 115 is substantially perpendicular to the conductive pad 113, and the redistribution layer 204 is in electrical contact with the bottom surface of the conductive pad 113.

Figure 9:
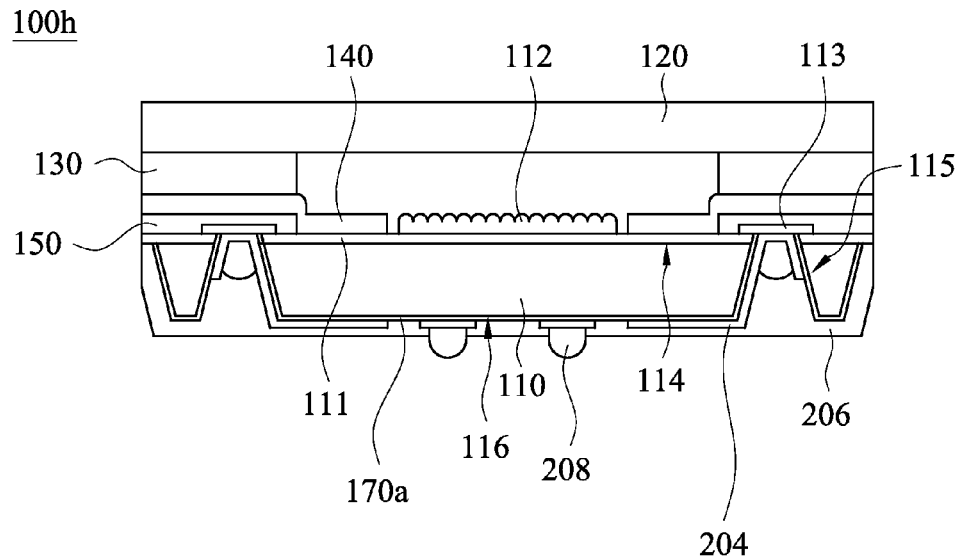
FIG. 9 is a schematic cross-sectional view of a semiconductor structure according to one embodiment of the present invention.

FIG. 9 is a schematic cross-sectional view of a semiconductor structure 100h according to one embodiment of the present invention. The difference between this embodiment and the embodiment shown in FIG. 8 is that the wall of the through hole 115 is an oblique surface, and an obtuse angle is formed between the wall of the through hole 115 and the conductive pad 113.

It is to be noted that the arrangements about the through hole 115, the isolation layer 170a, the redistribution layer 204, the solder mask layer 206, and the conductive structure 208 shown in FIGS. 7 to 9 may be selectively applied to the semiconductor structures of FIGS. 1, and 3 to 6.

When the arrangement about the through hole 115, the isolation layer 170a, the redistribution layer 204, the solder mask layer 206, and the conductive structure 208 shown in one of FIGS. 7 to 9 is applied to the structure of FIG. 1, the difference is that the light-shielding layer 140 does not extend to a position that is between the spacer 130 and the first surface 114.

When the arrangement about the through hole 115, the isolation layer 170a, the redistribution layer 204, the solder mask layer 206, and the conductive structure 208 shown in one of FIGS. 7 to 9 is applied to the structure of FIG. 4, the difference is that the isolation layer 170 covers the reflective layer 160 and the second surface 116.

When the arrangement about the through hole 115, the isolation layer 170a, the redistribution layer 204, the solder mask layer 206, and the conductive structure 208 shown in one of FIGS. 7 to 9 is applied to the structure of FIG. 5, the difference is that the isolation layer 190 is located on the wall surface of the through hole 115 and between the second surface 116 and the light-shielding layer 180.

When the arrangement about the through hole 115, the isolation layer 170a, the redistribution layer 204, the solder mask layer 206, and the conductive structure 208 shown in one of FIGS. 7 to 9 is applied to the structure of FIG. 6, the difference is that the isolation layer 190a covers the light-shielding layer 180 and the second surface 116.

Figure 10:
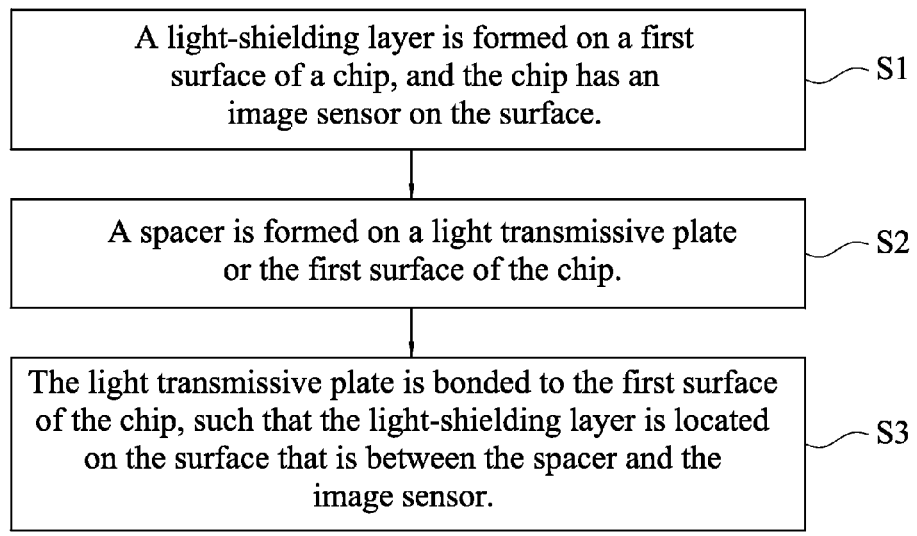
FIG. 10 is a flow chart of a manufacturing method of a semiconductor structure according to one embodiment of the present invention.

FIG. 10 is a flow chart of a manufacturing method of a semiconductor structure according to one embodiment of the present invention. The manufacturing method of the semiconductor structure includes the following steps. In step S1, a light-shielding layer is formed on a first surface of a chip, and the chip has an image sensor on the first surface. Thereafter, in step S2, a spacer is formed on a light transmissive plate or the first surface of the chip. Finally, in step S3, the light transmissive plate is bonded to the first surface of the chip, such that the light-shielding layer is located on the first surface that is between the spacer and the image sensor. The present invention is not limited to the sequence of the aforesaid steps. The semiconductor structure 100 shown in FIG. 1 may be obtained by utilizing the aforesaid steps.

Furthermore, the manufacturing method of the semiconductor structure may further include forming the light-shielding layer between the spacer and the first surface of the chip, such that the semiconductor structure 100a shown in FIG. 2 may be obtained.

The chip may have a conductive pad, a through hole that exposes the conductive pad, and a second surface that is opposite to the first surface. In one embodiment, the manufacturing method of the semiconductor structure may further include the steps of forming an isolation layer on the wall surface of the through hole and the second surface, forming a redistribution layer on the conductive pad and the isolation layer, forming a solder mask layer on the redistribution layer and the isolation layer, and forming a conductive structure on the redistribution layer that is on the second surface. As a result, the semiconductor structures of FIGS. 1 and 2 may selectively have the arrangements about the through hole, the isolation layer, the redistribution layer, the solder mask layer, and the conductive structure shown in FIGS. 7 to 9.

Figure 11:
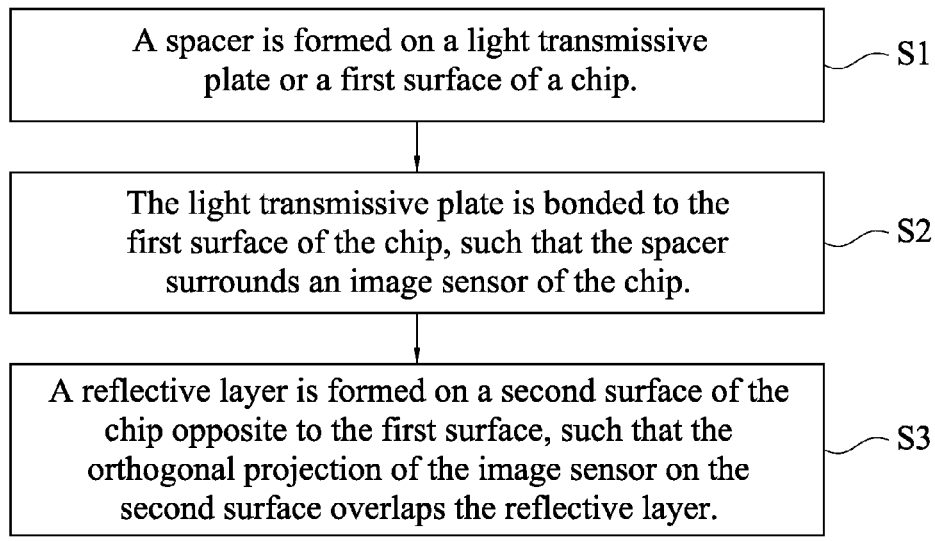
FIG. 11 is a flow chart of a manufacturing method of a semiconductor structure according to one embodiment of the present invention.

FIG. 11 is a flow chart of a manufacturing method of a semiconductor structure according to one embodiment of the present invention. The manufacturing method of the semiconductor structure includes the following steps. In step S1, a spacer is formed on a light transmissive plate or a first surface of a chip. Thereafter, in step S2, the light transmissive plate is bonded to the first surface of the chip, such that the spacer surrounds an image sensor of the chip. Finally, in step S3, a reflective layer is formed on a second surface of the chip opposite to the first surface, such that the orthogonal projection of the image sensor on the second surface overlaps the reflective layer. The present invention is not limited to the sequence of the aforesaid steps. The semiconductor structure 100b shown in FIG. 3 may be obtained by utilizing the aforesaid steps. Thereafter, if an isolation layer is formed to cover the reflective layer and the second surface, the semiconductor structure 100c shown in FIG. 4 may be obtained.

The chip may have a conductive pad and a through hole that exposes the conductive pad. In one embodiment, the manufacturing method of the semiconductor structure may further include the steps of forming the isolation layer that is on the wall surface of the through hole and covers the reflective layer and the second surface, forming a redistribution layer on the conductive pad and the isolation layer, forming a solder mask layer on the redistribution layer and the isolation layer, and forming a conductive structure on the redistribution layer that is on the second surface. As a result, the semiconductor structures of FIGS. 3 and 4 may selectively have the arrangements about the through hole, the isolation layer, the redistribution layer, the solder mask layer, and the conductive structure shown in FIGS. 7 to 9.

Figure 12:
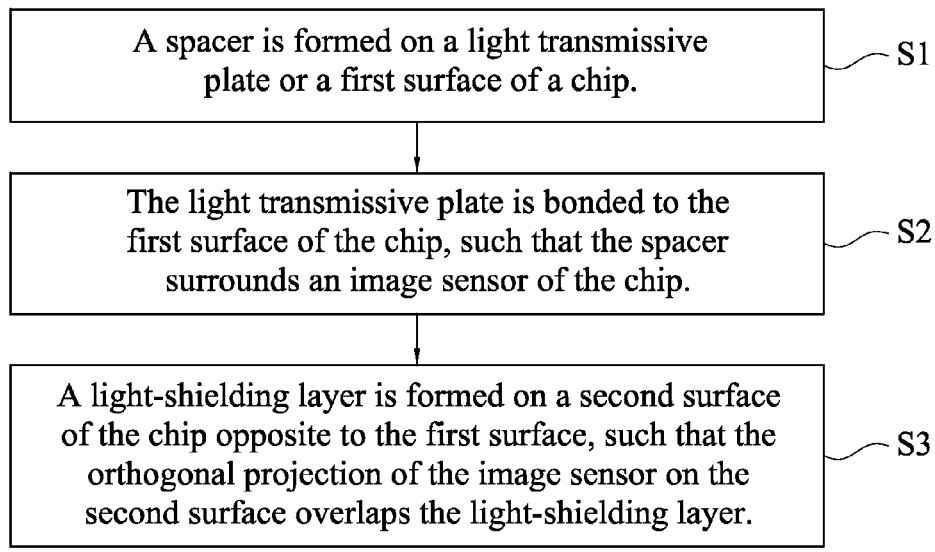
FIG. 12 is a flow chart of a manufacturing method of a semiconductor structure according to one embodiment of the present invention.

FIG. 12 is a flow chart of a manufacturing method of a semiconductor structure according to one embodiment of the present invention. The manufacturing method of the semiconductor structure includes the following steps. In step S1, a spacer is formed on a light transmissive plate or a first surface of a chip. Thereafter, in step S2, the light transmissive plate is bonded to the first surface of the chip, such that the spacer surrounds an image sensor of the chip. Finally, in step S3, a light-shielding layer is formed on a second surface of the chip opposite to the first surface, such that the orthogonal projection of the image sensor on the second surface overlaps the light-shielding layer. The present invention is not limited to the sequence of the aforesaid steps.

Moreover, the manufacturing method of the semiconductor structure may further include forming an isolation layer between the second surface of the chip and the light-shielding layer or forming an isolation layer to cover the light-shielding layer and the second surface of the chip. When the isolation layer is formed between the second surface of the chip and the light-shielding layer, the semiconductor structure 100d shown in FIG. 5 may be obtained. When the isolation layer is formed to cover the light-shielding layer and the second surface of the chip, the semiconductor structure 100e shown in FIG. 6 may be obtained.

The chip may have a conductive pad and a through hole that exposes the conductive pad. In one embodiment, the manufacturing method of the semiconductor structure may further include the steps of forming the isolation layer on the wall surface of the through hole and between the second surface and the light-shielding layer, forming a redistribution layer on the conductive pad and the isolation layer, forming a solder mask layer on the redistribution layer and the isolation layer, and forming a conductive structure on the redistribution layer that is on the second surface. As a result, the semiconductor structure of FIG. 5 may selectively have the arrangements about the through hole, the isolation layer, the redistribution layer, the solder mask layer, and the conductive structure shown in FIGS. 7 to 9.

In one embodiment, the manufacturing method of the semiconductor structure may further include the steps of forming the isolation layer that is on the wall surface of the through hole and covers the light-shielding layer and the second surface, forming a redistribution layer on the conductive pad and the isolation layer, forming a solder mask layer on the redistribution layer and the isolation layer, and forming a conductive structure on the redistribution layer that is on the second surface. As a result, the semiconductor structure of FIG. 6 may selectively have the arrangements about the through hole, the isolation layer, the redistribution layer, the solder mask layer, and the conductive structure shown in FIGS. 7 to 9.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor structure, comprising:
    a chip having an image sensor, a first surface, a second surface opposite to the first surface, two through holes extending from the first surface to the second surface, and a conductive pad exposed through one of the two through holes, wherein the image sensor is located on the first surface;
    a light transmissive plate disposed on the first surface of the chip and covering the image sensor;
    a spacer between the light transmissive plate and the first surface of the chip, and surrounding the image sensor;
    a reflective layer located on the second surface of the chip, wherein the reflective layer continuously extends from a position of the second surface adjacent to one of the two through holes to another position of the second surface adjacent to other one of the two through holes, and an orthogonal projection of the image sensor on the second surface overlaps the reflective layer, and an orthogonal projection of the reflective layer on the first surface of the chip is surrounded by the spacer, and the reflective layer is free from direct and indirect coverage by the spacer; and
    an isolation layer located on wall surfaces of the two through holes and covering the reflective layer and the second surface.

2. The semiconductor structure of claim 1, wherein the reflective layer is made of a material comprising aluminum-copper alloy.

3. The semiconductor structure of claim 1, further comprising:
    a redistribution layer located on the conductive pad and the isolation layer;
    a solder mask layer located on the redistribution layer and the isolation layer; and
    a conductive structure located on the redistribution layer that is on the second surface.

4. The semiconductor structure of claim 3, wherein at least a portion of an orthogonal projection of the conductive structure on the first surface overlaps the image sensor.

5. The semiconductor structure of claim 1, wherein an area of the reflective layer is greater than an area of the image sensor.

6. The semiconductor structure of claim 1, wherein the reflective layer is an anti-infrared layer.

7. A semiconductor structure, comprising:
    a chip having an image sensor, a first surface, a second surface opposite to the first surface, and a through hole extending from the first surface to the second surface, wherein the image sensor is located on the first surface;

a light transmissive plate disposed on the first surface of the chip and covering the image sensor;

a spacer between the light transmissive plate and the first surface of the chip, and surrounding the image sensor;

a light-shielding layer located on the second surface of the chip, wherein an orthogonal projection of the image sensor on the second surface overlaps the light-shielding layer, and an orthogonal projection of the light-shielding layer on the first surface of the chip is surrounded by the spacer and the light-shielding layer is free from direct and indirect coverage by the spacer; and an isolation layer on a wall surface of the through hole and between the second surface and the light-shielding layer.

8. The semiconductor structure of claim 7, wherein the light-shielding layer is made of a material comprising black photoresist.

9. The semiconductor structure of claim 7, wherein the chip has a conductive pad exposed through the through hole, and the semiconductor structure further comprises:
 a redistribution layer located on the conductive pad and the isolation layer;
 a solder mask layer located on the redistribution layer and the isolation layer; and
 a conductive structure located on the redistribution layer that is on the second surface.

10. The semiconductor structure of claim 9, wherein at least a portion of an orthogonal projection of the conductive structure on the first surface overlaps the image sensor.

11. The semiconductor structure of claim 7, wherein an area of the light-shielding layer is greater than an area of the image sensor.

12. The semiconductor structure of claim 7, wherein the light-shielding layer is an anti-infrared layer.

13. A manufacturing method of a semiconductor structure, comprising:
 forming a spacer on a light transmissive plate or a first surface of a chip;
 bonding the light transmissive plate to the first surface of the chip, thereby enabling the spacer to surround an image sensor of the chip, wherein the chip has two through holes extending from the first surface to the second surface and a conductive pad exposed through one of the two through holes;
 forming a reflective layer on a second surface of the chip opposite to the first surface, thereby enabling an orthogonal projection of the image sensor on the second surface to overlap the reflective layer, wherein the reflective layer continuously extends from a position of the second surface adjacent to one of the two through holes to another position of the second surface adjacent to other one of the two through holes, an orthogonal projection of the reflective layer on the first surface of the chip is surrounded by the spacer, and the reflective layer is free from direct and indirect coverage by the spacer; and
 forming an isolation layer that is on wall surfaces of the two through holes and covers the reflective layer and the second surface.

14. The manufacturing method of claim 13, further comprising:
 forming a redistribution layer on the conductive pad and the isolation layer;
 forming a solder mask layer on the redistribution layer and the isolation layer; and
 forming a conductive structure on the redistribution layer that is on the second surface.

15. A manufacturing method of a semiconductor structure, comprising:
 forming a spacer on a light transmissive plate or a first surface of a chip;
 bonding the light transmissive plate to the first surface of the chip, thereby enabling the spacer to surround an image sensor of the chip, wherein the chip has a second surface opposite the first surface and a through hole extending from the first surface to the second surface;
 forming an isolation layer on a wall surface of the through hole and the second surface of the chip; and
 forming a light-shielding layer on the isolation layer that is on the second surface, thereby enabling an orthogonal projection of the image sensor on the second surface to overlap the light-shielding layer, wherein the isolation layer is between the second surface and the light-shielding layer, and an orthogonal projection of the light-shielding layer on the first surface of the chip is surrounded by the spacer, and the light-shielding layer is free from direct and indirect coverage by the spacer.

16. The manufacturing method of claim 15, wherein the chip has a conductive pad exposed through the through hole, and the manufacturing method further comprises:
 forming a redistribution layer on the conductive pad and the isolation layer;
 forming a solder mask layer on the redistribution layer and the isolation layer; and
 forming a conductive structure on the redistribution layer that is on the second surface.

* * * * *